United States Patent [19]

Oshida et al.

[11] Patent Number: 5,247,329
[45] Date of Patent: Sep. 21, 1993

[54] PROJECTION TYPE EXPOSURE METHOD AND APPARATUS

[75] Inventors: Yoshitada Oshida, Fujisawa; Toshiei Kurosaki, Katsuta; Akira Inagaki; Yoshihiko Aiba, both of Yokohama, all of Japan

[73] Assignee: Hitachi, Ltd., Tokyo, Japan

[21] Appl. No.: 813,002

[22] Filed: Dec. 24, 1991

[30] Foreign Application Priority Data

Dec. 25, 1990 [JP] Japan .................................. 2-405636

[51] Int. Cl.$^5$ .............................................. G03B 27/42
[52] U.S. Cl. ......................................... 355/53; 355/68
[58] Field of Search ...................................... 355/53, 68

[56] References Cited

U.S. PATENT DOCUMENTS 5,053,614 10/1991 Yui et al. ................................ 355/53
5,117,254 5/1992 Kawashima et al. .................. 355/53

Primary Examiner—Monroe H. Hayes
Attorney, Agent, or Firm—Antonelli, Terry Stout & Kraus

[57] ABSTRACT

A projection type exposure apparatus and method comprising an exposure illumination light source, an exposure illumination system, a mask or reticle on which an original pattern to be projected on the exposed matter is drawn, an optical projection system, a stage for retaining the exposed matter and a mechanism for finely moving the stage along the exposure optical axis. The apparatus is provided with an exposure detection pattern area on the mask, detection illumination means for projecting on the exposure detection pattern area a light ray which is the same or almost the same in wavelength as exposure light having a desired directivity, exposure detection means for detecting the transmitted or reflected light diffracted by 1 degree after the light carrying the image formed on the exposed matter by the light passed through the above-noted optical projection system after projection by the detection illumination means onto the exposure pattern and then diffracted goes in reverse through the above-noted optical projection system and forms an image again on the exposure pattern on the above-noted mask and a control circuit for driving and controlling the above-noted fine movement mechanism by using the signal obtained by the exposure detection means.

9 Claims, 16 Drawing Sheets

PROJECTION TYPE EXPOSURE METHOD AND APPARATUS

BACKGROUND OF THE INVENTION

The present invention relates to a method and apparatus for the projection type exposure of fine patterns such as semiconductor circuits, and is particularly concerned with a projection type exposure method and apparatus for achieving an accurately focused status for shallow focus depth exposure light used to expose submicron patterns.

Conventional projection type exposure apparatus, as shown in the Japanese Patent Application Laid-Open No. 58-7136, finds the best focusing location of the reduction lens for each wafer or lot of wafers and offsets the focus. To be more specific, as in the above-noted conventional apparatus, patterns on the mask are detected by a detector which has a slit and is installed on the wafer stage, the height for providing the most intense light is obtained, and exposure is performed for one wafer or one lot with this height being used as the offset.

In the above-noted apparatus of the prior art, no attempt has been made to deal with the subtle variation of the focal surface due to exposure light absorbed in the lens and changed into heat nor the fine deviation of the reduction lens varying with time due to other conditions. Therefore, as the focus margin decreases greatly with the miniaturization of patterns, it is more and more insufficient to obtain focus offset values and perform correction for each wafer or lot of wafers. The true exposure location needs to be obtained for every exposure operation or a plurality of times for one wafer.

SUMMARY OF THE INVENTION

It is therefore the object of the present invention to provide a projection type exposure method and apparatus capable of exposing to projected light a fine circuit pattern whose conductor is not more than 0.5 μm wide so that best focusing will be maintained even when the focus point varies with time during the operation of exposing one wafer (substrate) and therefore to eliminate the above-noted disadvantage of the prior art.

To achieve the above object, exposure light or light which is almost the same in wavelength as exposure light is projected onto the fine pattern disposition provided on a mask (reticle), then these patterns are imaged on the exposed matter (substrate), the light reflected from the substrate forms an image again, and the intensity of the diffracted light is detected so that the focusing by the exposure light at its correct exposure position will be achieved for every exposure operation.

According to the present invention, to be more specific, a projection type exposure method in which the exposure light is projected onto the pattern drawn on the mask or reticle, transmitted through the mask or reflected from it and projected by an optical projection system on the exposed matter so as to form an image on it is characterized in that an exposure detection pattern area made up of disposed fine patterns is provided on the above-noted drawn pattern on the mask or on a surface around it and that a light ray which is the same or almost the same in wavelength as exposure light having a desired directivity is projected on the exposure detection pattern area and that the light carrying the above-noted exposure detection pattern imaged on the exposed matter by the light diffracted by the above-noted fine patterns and passed through the above-noted optical projection system goes in reverse through the optical projection system, and forms an image again on the above-noted exposure detection pattern area to allow the 1st order transmitted or reflected light to be detected and used to perform the focusing for exposure with regard to the mask and the exposed matter.

In addition, a projection type exposure apparatus according to the present invention is characterized in that in an exposure apparatus comprising an exposure illumination light source, an exposure illumination system, a mask or reticle on which an original pattern to be projected on the exposed matter is drawn, an optical projection system, a stage for retaining the exposed matter and a mechanism for finely moving the stage along the exposure optical axis, the projection type exposure apparatus is provided with an exposure detection pattern area on the mask made up of fine pattern dispositions on the above-noted pattern above it or on the surface around it, detection illumination means for projecting on the exposure detection pattern area a light ray which is the same or almost the same in wavelength as exposure light having a desired directivity, exposure detection means for detecting the transmitted or reflected light diffracted by 1 degree after the light carrying the image formed on the exposed matter by the light passed through the above-noted optical projection system after projected by the detection illumination means onto the exposure pattern and then diffracted goes in reverse through the above-noted optical projection system and forms an image again on the exposure pattern on the above-noted mask and a control circuit for driving and controlling the above-noted fine movement mechanism by using the signal obtained by the exposure detection means.

Now, as semiconductor circuits grow finer and denser, exposure light has short wavelengths, and projection lenses have their numerical aperture (NA) enlarging. The focus depth for the exposure of fine circuits whose conductors are 0.5 μm wide is not more than ±0.9 μm, and that for exposing fine circuits whose conductors are 0.3 μm wide is not more than ±0.5 μm. These focus depths suggest the resolution within the above distance of the best focusing location (height) of the lens at any point inside the resolution field. In reality, therefore, the best focusing surface is not a plane but a somewhat curved surface (image curvature), and the exposed matter, that is, wafers have irregularities on the surface and are curved over the whole length. For these reasons the focusing margin today is very demanding, compared to the days when LSIs whose conductors are as wide as 0.8 μm were on the production line.

A projection type exposure method and apparatus according to the present invention, therefore, aims to always ensure this focusing margin. To be more specific, reticle 2 as shown in FIG. 1 has a circuit pattern 21 drawn on it, and its periphery is what is called an area for scribing, denoted by the numeral 22 here. This portion is used as the allowance for cutting the wafer into chips. The portion has an exposure detection pattern area 3 as shown in FIG. 2. This area has a disposition of plenty of fine patterns 31 whose width each is W, whose apertures are D wide along the disposition length and which are positioned with the pitch P along the disposition length. Assuming that the angle is $\theta_0$ between the normal line (1) for the pattern drawn on the reticle and the principal ray of the incident light, which is the same in wavelength as the exposure light illuminating this exposure pattern area 3 and that the diffraction angle is $\theta_1$ between the principal ray of light 300 diffracted by the fine pattern disposition 31 and the line 1, the following equation is established:

$$P = \lambda/(\sin \theta_0 - \sin \theta_1) \tag{1}$$

Here, $\lambda$ is the wavelength of the detection light 30. If light 301 transmitted without diffraction (0th order light) is assumed to meet the outside of the incidence pupil 41 of a reduction lens 4 and the 1st order light passes almost at the center of the pupil 41, the following equation is established, using the numerical aperture (NA) and the magnification 1/M (M≧1) of the reduction lens:

$$\sin \theta_0 - \sin \theta_1 \geq NA/M \tag{2}$$

Substituting the equation (2) into the equation (1) gives:

$$P > \lambda M/NA$$

Therefore, assuming NA=0.5 and M=5, the light passing through the fine pattern disposition 31 and satisfying the condition expressed by the equation (3) so that P will be for the exposure wavelength $\lambda = 0.365$ nm for i and the exposure wavelength KrF=0.248 nm for KrF exima-laser ($\lambda = 0.248$ nm) has only its 1st order diffracted light 300 traveling through the reduction lens pupil and images on the wafer 5 a pattern which is uniformly elongated along the Y-axis without keeping the fine disposition structure along the Y-axis of the pattern 31 and is W/M wide (because it is reduced by the proportion 1/M). Here, the width W/M of this bar-like pattern is specified as near the resolution limit of the reduction lens. Then, if the reticle and the wafer are positioned to allow the reduction lens to have the best focusing, the bar-like pattern imaged by the above-noted 1st order diffracted light on the wafer has the narrowest lines, and the pattern grows wider as the lens is defocused. In this manner, the light carrying the bar-like pattern imaged in connection with the fine pattern disposition by the 1st order diffracted light on the wafer is reflected from the wafer surface, goes in reverse on the optical path where it has come during its projection onto the wafer and is directed from the reduction lens (upward) to the fine pattern disposition on the reticle. At this time, in the same way as the above-noted width of the projected pattern in response to focusing conditions when it is imaged on the wafer, a bar-like pattern having the narrowest lines (almost as narrow as W) is formed in connection with the fine pattern disposition. When the lens is defocused, a wider pattern is imaged, and the projected light energy within the width W of the fine pattern disposition is smaller than it is when the best focusing is achieved. As a result, the 1st order light forming an image again on this fine pattern disposition is intensest in time of the best focusing. This 1st order light does not mix with the illumination light used for exposing the circuit pattern on the reticle nor the pattern diffracted light transmitted through the reticle and then used for exposure, and therefore can be separated for the detection for focusing. As understood from the above, the best focusing location can be found in stepwise and repeated manners with the wafer being at the location for exposure, and the above-noted subtle variation occurring because of such a cause as light absorption when the entire wafer surface is exposed dozens of times can be detected each time the exposure operation is performed. Therefore, a fine circuit pattern whose conductor is not more than 0.5 μm wide can be exposed so that best focusing will be maintained even when the focus point varies with time during the operation of exposing one wafer (substrate).

According to the present invention, the accurate focusing for exposing to projected light such fine patterns as an LSI whose conductors are not more than 0.5 μm wide can be performed each time the exposure operation can be performed or at short intervals, even when the focus point varies in response to exposure hysteresis or environmental change. Therefore, controlling and keeping the exposure apparatus within a desired focus depth can be achieved despite such obstacles as the irregularities on the wafer, and so it is possible to produce LSIs whose conductors are not more than 0.5 μm wide with a higher yielding rate.

DETAILED DESCRIPTION OF THE PREFERRED EMBODIMENT

Figure 1:
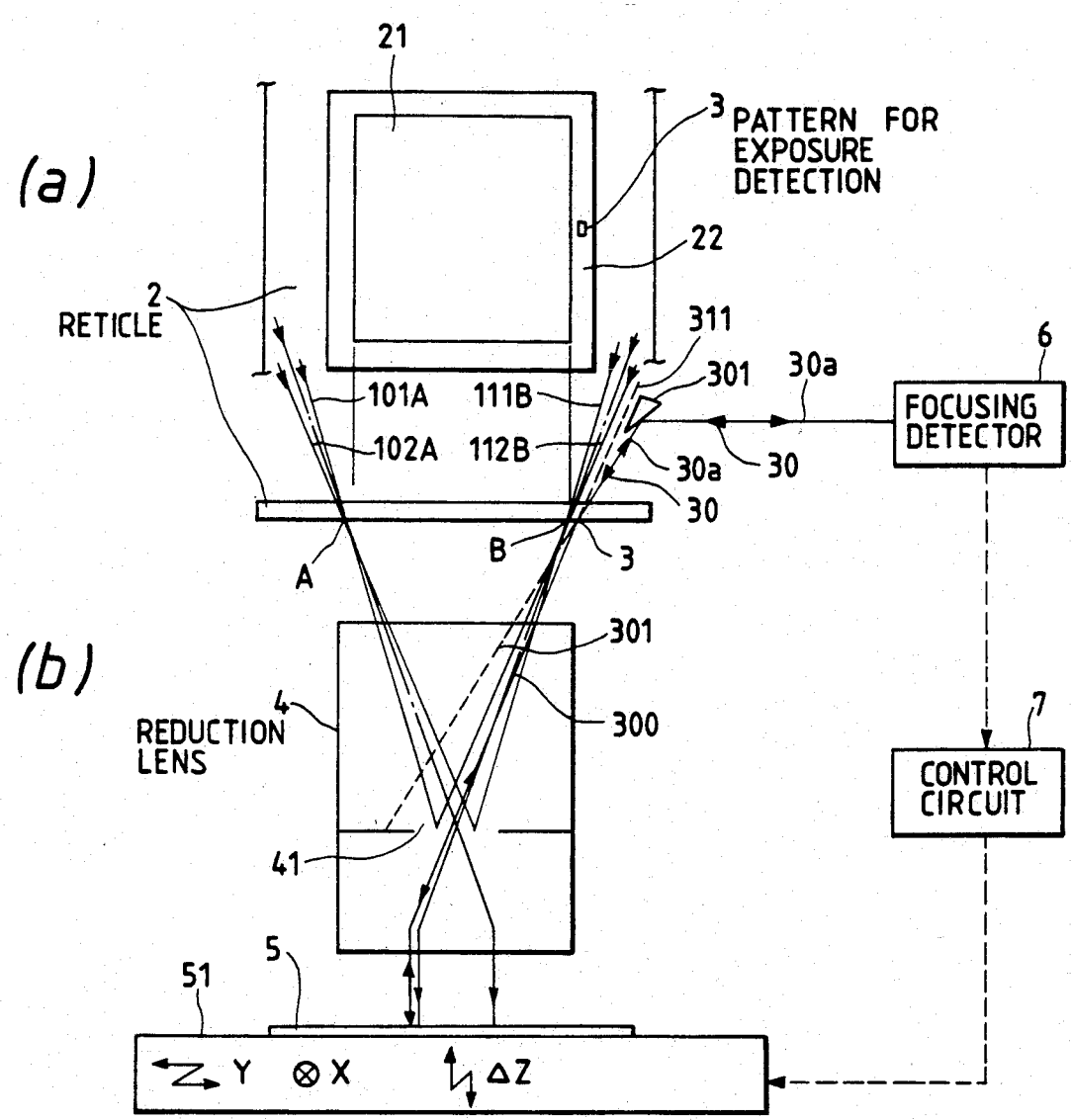
FIG. 1 is a block diagram of a projection type exposure apparatus which is a first embodiment of the present invention.
Figure 2:
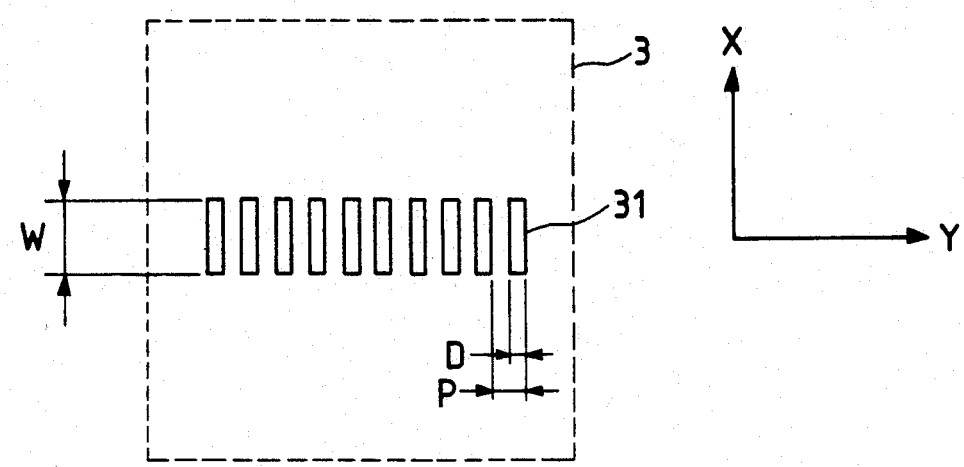
FIG. 2 is an illustration of the fine pattern disposition on an original pattern.

Referring now to FIG. 1, there is shown an embodiment of the present invention in which exposure light 101A, 102A, 111B and 112B, directed to the outermost peripheries A and B of a circuit pattern 21 drawn on the bottom surface of reticle 2, travel through the reticle 2 and the pupil 41 of a reduction lens 4 and form a reduced image of the circuit pattern on a wafer 5 on a wafer stage 51. To expose the entire wafer surface, the wafer stage 51 is moved stepwise in the X-Y direction, the above-noted exposure being repeated dozens of times. Since part of the energy of the exposure light passing through the reduction lens 4 is absorbed by the lens 4, the focus point of the lens is moved a little by $\Delta Z$ along the Z-axis because of the hysteresis caused by the exposure light. This variation is of the order of submicron amounts. However, since the focus depth is not more than $\pm 0.9$ $\mu m$ for the fine circuit pattern 21 whose conductor is not more than 0.5 $\mu m$ wide, it is necessary to detect and correct the focus point accurately. An exposure light projection focusing detector 6, which will be described in detail later, projects light, which is the same in wavelength as fine circuit pattern exposure light (for instance, the i beam, KrF beam or ArF exima-laser beam), via a mirror 301 on a disposition 31 of fine patterns drawn in an exposure detection pattern area 3 inside an area for scribing 22 contiguous to the circuit pattern 21 on the reticle 2. This projected light 30, as described later, has a desired directivity, so the principal ray of this projected light 30 travels through the center of the exposure light detection pattern 3, 0th order transmitted light 301 (the dashed line in FIG. 1) thus being shielded by the outside of the reduction lens pupil 41 before reaching the wafer. On the other hand, 1st order diffracted light 300 passes through the center of the reduction lens 41 and reaches almost perpendicularly the area equivalent to the wafer area for scribing. The pattern projected on the wafer, different from the fine pattern disposition image denoted by 31 in FIG. 2, is uniformly elongated along the Y-axis without the fine structure along the Y-axis, and is W/M (1/M is the magnification of the reduction lens) wide along the X-axis. The light forming this projected pattern is reflected from the wafer, goes in reverse on the optical path and is incident from under upon the disposition 31 of fine patterns in the exposure detection pattern area 3 on the reticle. If the reticle 2 and the wafer 5 are in the correct focused status, the pattern carried by the light entering the disposition 31 is almost W in width, that is, narrowest and therefore has the highest energy intensity within the width W. In other words, if they are not in the correct focused status, the pattern is wider, and there is smaller energy inside the width W. It follows that the 1st order diffracted light, which is transmitted and diffracted by 31 and directed to the exposure light projection focusing detector 6, is intensest when the focusing is achieved (the detection method will be described in detail later). Therefore, by a method like mountain climbing control using a control circuit 7, the wafer stage 51 is finely moved in the vertical direction to maximize the detected signal strength, namely, to achieve the focused status.

Figure 3:
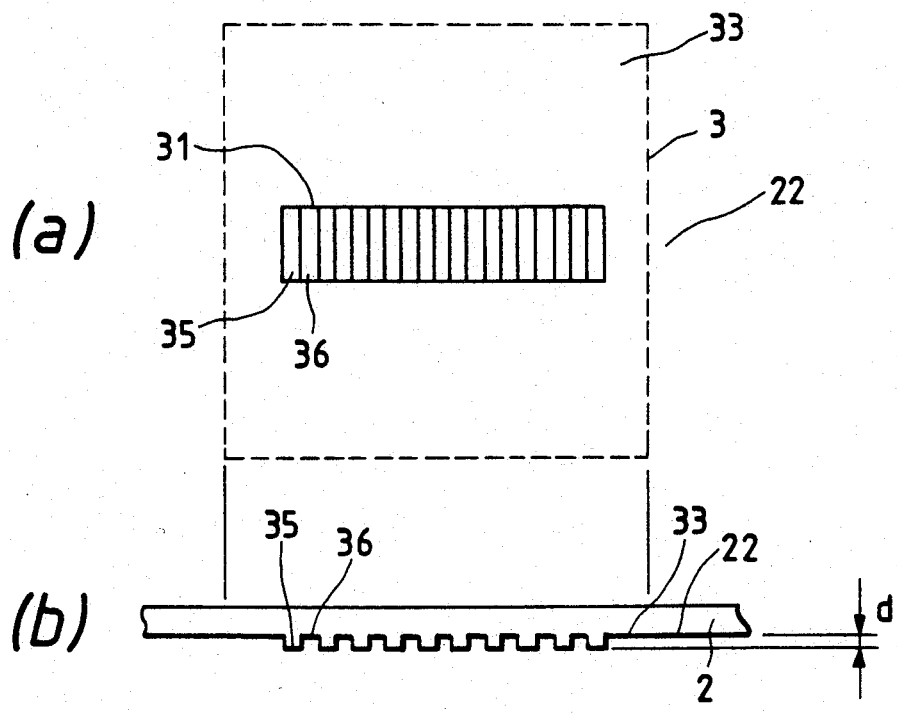
FIG. 3 is a first example of the fine pattern on an original pattern.
Figure 4:
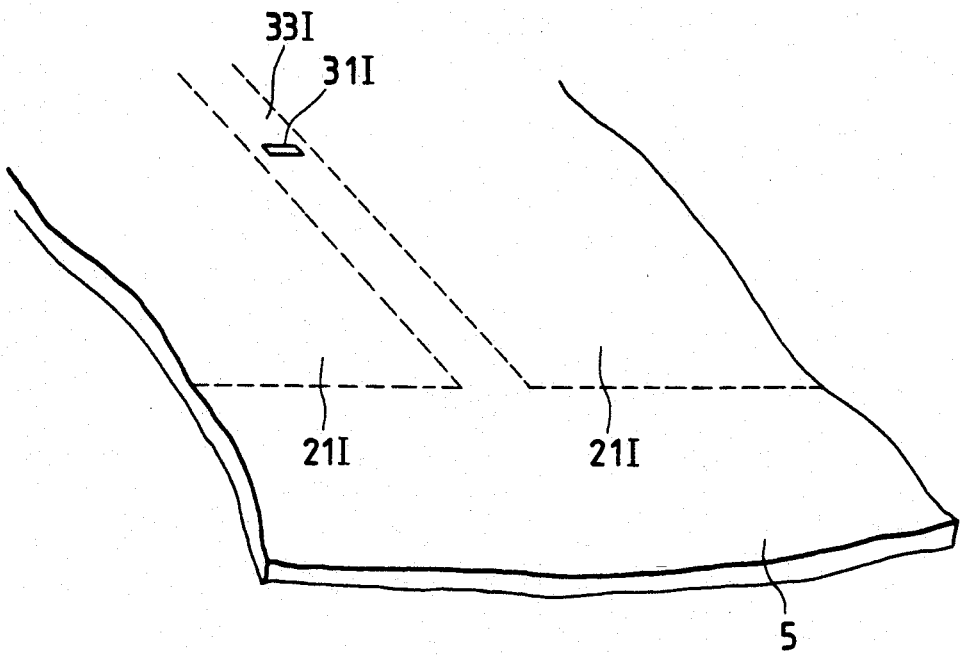
FIG. 4 is an illustration of the top surface of a wafer.
Figure 5:
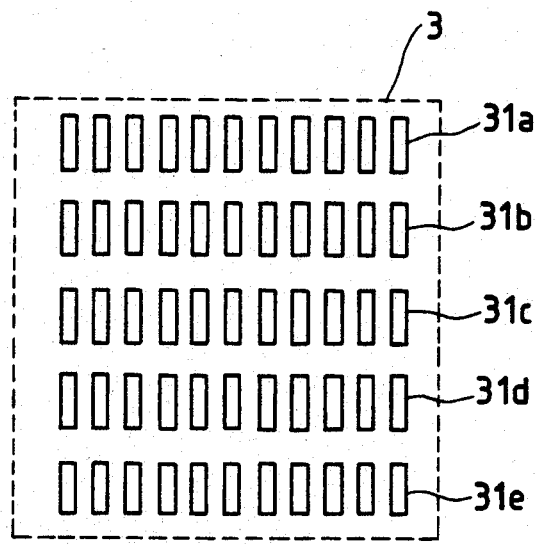
FIG. 5 is a second example of the fine pattern on an original pattern.

FIG. 3 illustrates an embodiment of the present invention. FIGS. 1, 2 and 3 share common reference numerals. In the embodiment shown in FIG. 2, each minute rectangular pattern in the disposition 31 of fine patterns on the reticle consists of a transmitting portion and a shielding portion. However, In the embodiment shown in FIG. 3, minute rectangular patterns 35 and 36 transmit light but have a level difference d as shown in the side view. This level difference causes the light passing through 35 to go behind the one through 36 by the phase delay $\pi$. Put otherwise, this pattern is a fine pattern of phases which provides phase modulation to the wavelengths, using level difference. The use of this pattern gives the 1st order diffraction efficiency not less than twice as large as the pattern shown in FIG. 2. Considering the two times of diffraction occurring when the light passes through 31 during its projection and detection, therefore, this embodiment achieves the detection light intensity not less than 4 times as high as the embodiment shown in FIG. 2. The fine pattern disposition 31 shown in FIG. 3 is projected, as described earlier, as a bar-like pattern 311 on the area for scribing between two circuit patterns 211 on the wafer. Concerning this pattern periphery 33I, whether the reticle is preserved or not decides the selection between light shielding and light transmitting for the periphery 33 of the fine pattern disposition 31.

Figure 6:
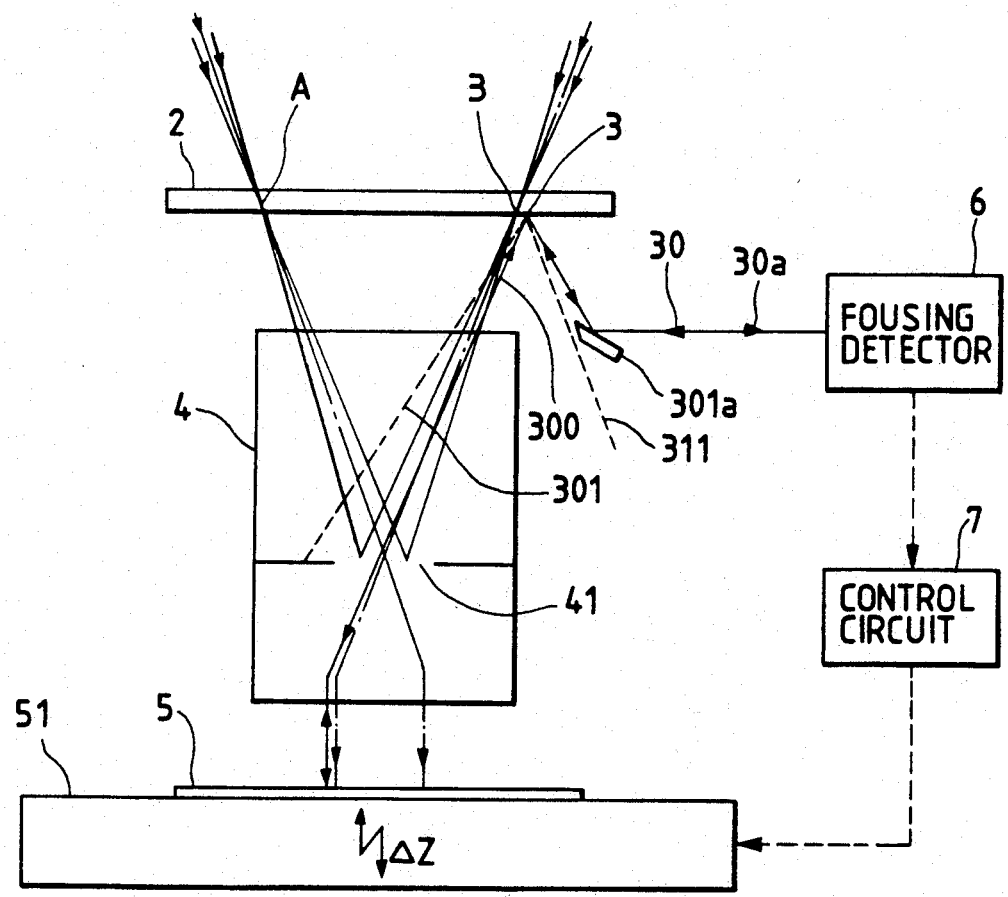
FIG. 6 is a block diagram of a projection type exposure apparatus which is a second embodiment of the present invention.
Figure 7:
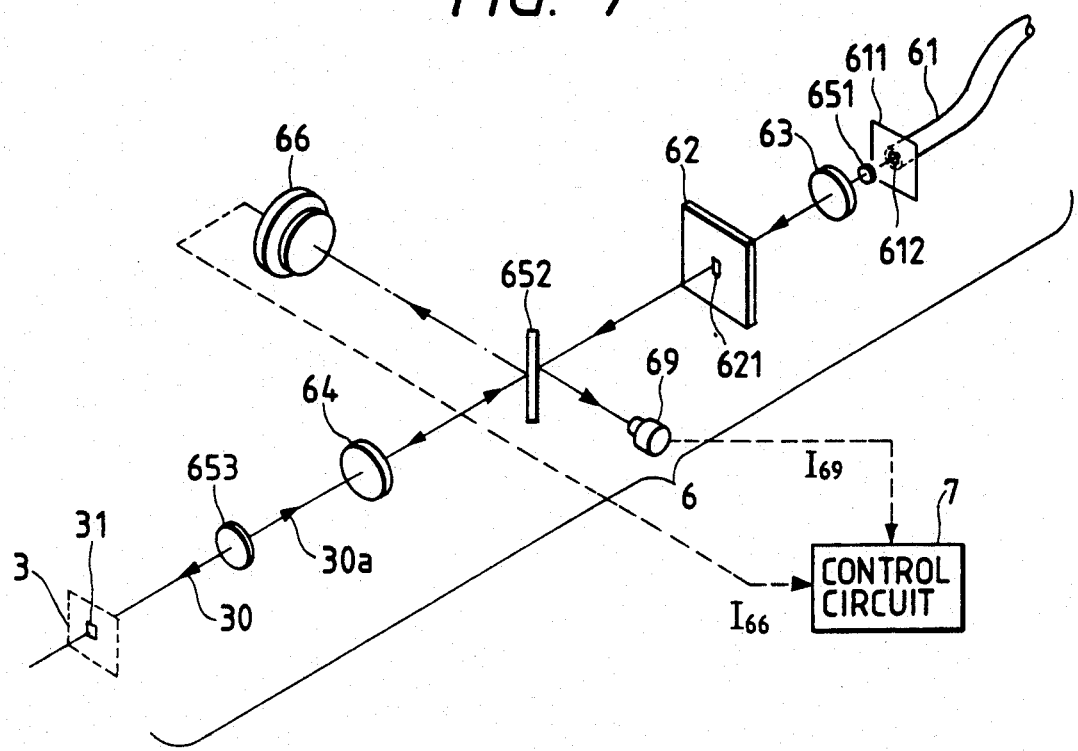
FIG. 7 is a first illustration of a focusing detector according to the present invention.
Figure 8:
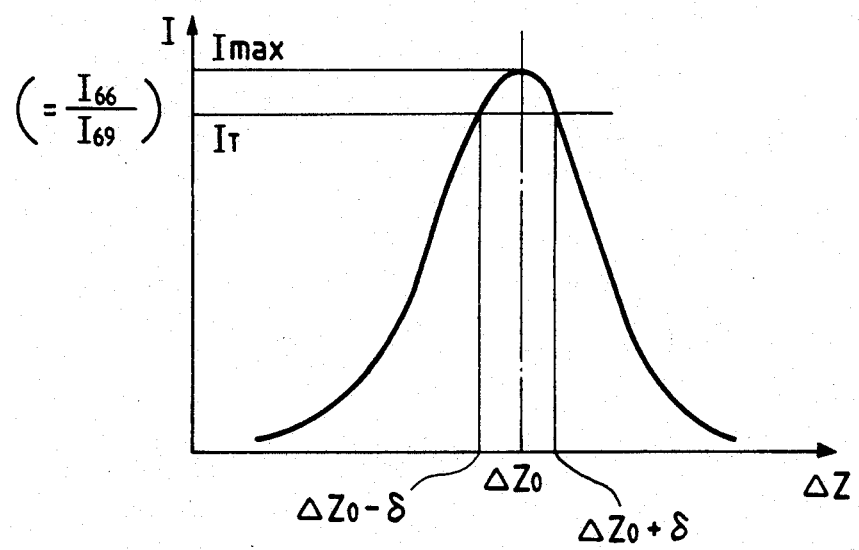
FIG. 8 is a graphical representation of a signal obtained for focusing.

FIG. 6 illustrates an embodiment of the present invention. FIGS. 1 and 6 share common reference numerals. Illumination light 30 for detection, which is the same in wavelength as the exposure light, is directed upward by a mirror 301a to the exposure detection pattern area 3, the 1st order diffracted light 300 of the light reflected from this pattern 3 forms a bar-like W/M wide pattern on the wafer 5. The light carrying the bar-like pattern which has been reflected from the wafer and imaged again on the reticle is reflected by the fine pattern disposition, and its 1st order diffracted light 300 is reflected from the mirror 301a and reaches the exposure light projection focusing detector 6. From now, an embodiment of the exposure light projection focusing detector 6 shown in FIGS. 1 and 6 will be described with reference to FIG. 7. Part of the light emitted by a mercury lamp in an exposure illumination system is directed by a fiber bundle 61, whose end is provided with an aperture plate 611 having an aperture 612 in it, passed through the aperture 612 having a desired diameter $D_I$, passed through a polarizing plate 651 and then condensed by a lens 63 in such a manner that an aperture 621 in an illumination field shield 62 can be illuminated. In association with the lens 63 and another one 64, which will be described later, the aperture 612 conjugates (is in imaging relation) with the reduction lens pupil 41 so that specifying the aperture size $D_I$ as desired will allow the light passing through the exposure detection pattern area on the reticle and through the reduction lens to form on the wafer a pattern showing preferable resolution. Not less than 95% of the light passed through the aperture 621 clears a polarized light beam splitter 652. The rest, 5% is reflected and enters a light intensity monitor 69. The linearly polarized light (P polarized light) passed through the polarized light beam splitter 652 enters the lens 64 and is converted by a wavelength plate 653 into circularly polarized light. In association with the lens 64, the aperture 621 in the illumination field shield 62 forms an image at a location corresponding to the exposure detection pattern area (not shown in FIG. 7) on the reticle. This means that it illuminates only the exposure detection pattern area 3 within the area for scribing 22 on the reticle 2 shown in FIGS. 1 and 6. No light for detection reaches the circuit pattern 21 which is to be exposed and transferred to the wafer. The light 30 illuminating the reticle passes through the reticle, its 1st order diffracted light traveling through the reduction lens to illuminate the wafer. The light illuminating the wafer (300), as described in reference to FIGS. 1 and 6, is reflected from the wafer and comes back as detection light 30a to the exposure light projection focusing detector 6. The returned detection light 30a is changed by the wavelength plate into S linearly polarized light, is reflected from the polarized light beam splitter 652 and enters a light detector 66 for focusing with the result that light intensity $I_{66}$ is obtained. In order to correct the fluctuation of the light source used for the detection, the intensity $I_{69}$ obtained by the above-noted light intensity monitor 69 is used by a control circuit 7 to issue a signal representing $I = I_{66}/I_{69}$ as shown in FIG. 8. This signal I changes in response to the variation $\Delta Z$ of the wafer stage height Z as shown in the graph in FIG. 8. At the location for perfect focusing, i.e., when $\Delta Z$ equals $\Delta Z_0$, I becomes the maximum value Imax. Therefore, the wafer stage 51 is moved finely in vertical direction so that the signal I will represent the maximum value. This may be carried out by constantly conducting the mountain climbing control using the signal I or by stopping the vertical stage movement when the value exceeds a certain threshold during mountain climbing control as shown in FIG. 8.

Figure 9:
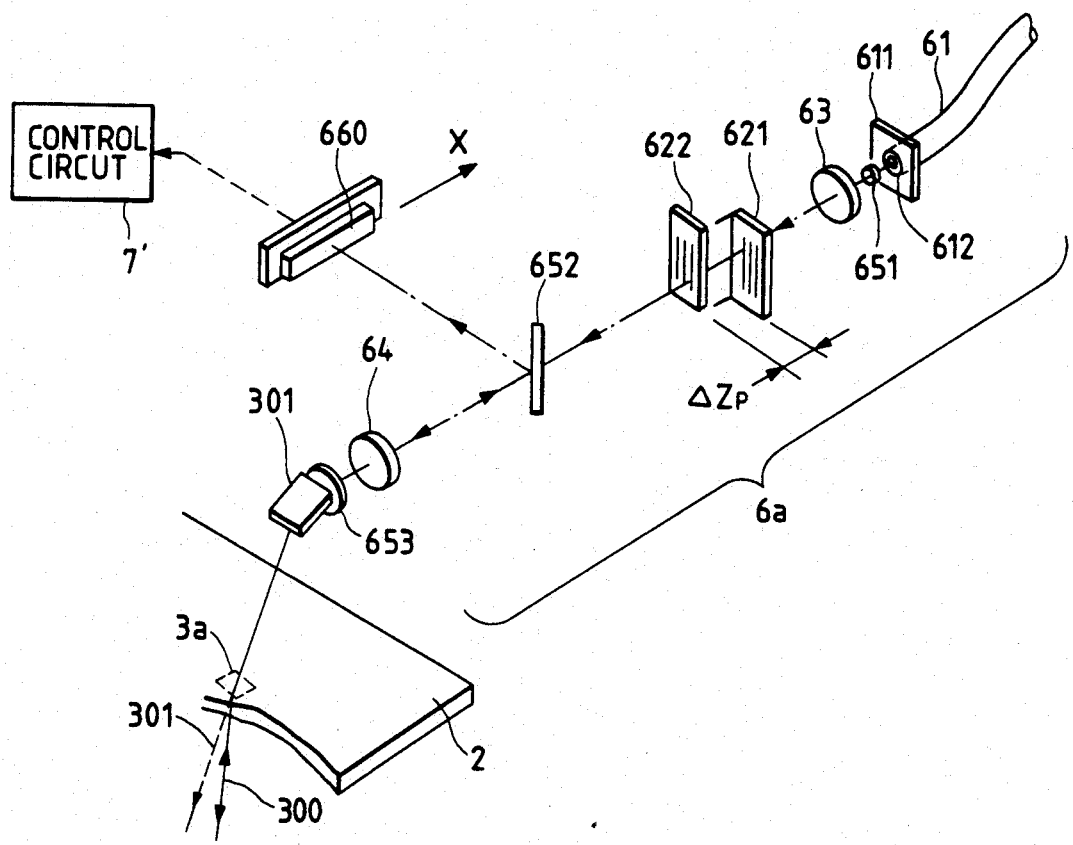
FIG. 9 is a second illustration of a focusing detector according to the present invention.
Figure 10:
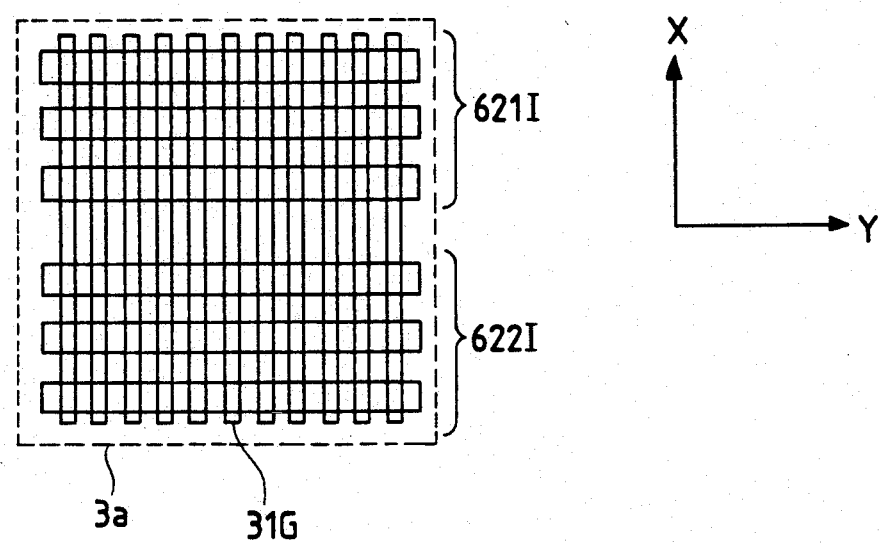
FIG. 10 is a third example of the fine pattern on an original pattern.
Figure 11:
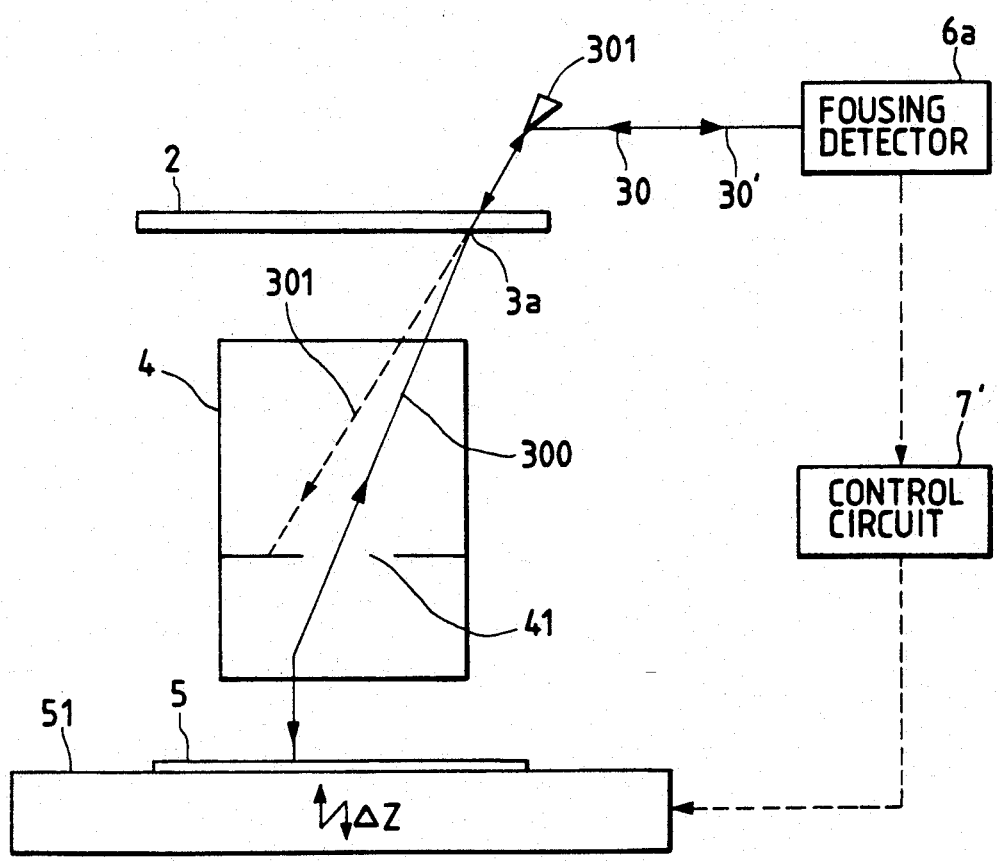
FIG. 11 is a block diagram of a projection type exposure apparatus which is a third embodiment of the present invention.
Figure 12:
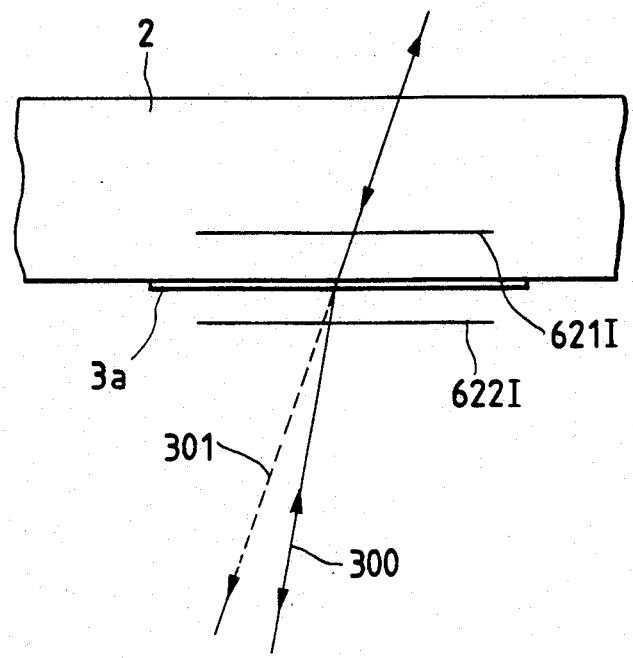
FIG. 12 is an explanatory illustration of a reticle section and image locations.

FIG. 9 illustrates an exposure light projection focusing detector 6 which embodies the present invention. FIGS. 7 and 9 share common reference numerals. The detection light coming from the exposure light source passes through the aperture 612 for obtaining desired directivity illumination, then the polarizing plate 651, the lens 63 and stripe patterns 621 and 622. 621 and 622 are placed at locations $\Delta Zp$ apart from each other along the optical axis. The light passed through 621 and 622 travels through the polarized light beam splitter 652, lens 64, wavelength plate 653, and is reflected from the mirror 301 and then directed to the exposure detection pattern area 3a on the reticle 2. This pattern 3a, as shown in FIG. 10, is a grating, made up of the uniform grid pattern 31G. The 0th order light passed through the grating reaches the outside of the reduction lens pupil 41, short of the wafer, as shown in FIG. 11. On the other hand, 1st order diffracted light 300 passes nearly at the center of the reduction lens 41 and reaches perpendicularly the wafer. The stripe patterns 621 and 622 are imaged by the lens 64 above and below the exposure detection grating pattern 3a on the pattern drawn surface on the reticle 2, as shown in FIG. 12. In other words, the stripe patterns 621 and 622 shown FIG. 9 are imaged at locations 621I and 622I respectively. Viewed from above the reticle, as shown in FIG. 10, the exposure detection pattern area 3a appears to be crossed by the images 621I and 622I of the stripe patterns 621 and 622. Since not subject to this grating with regard to the imaging relation along the X-axis though passed though the exposure detection pattern 3a, the light 1st order diffracted by the grating and passed through the reduction lens, if the wafer is in imaging relation with the reticle, forms the stripe pattern 621 $\Delta Zw$ above the wafer and the stripe pattern 622 $-\Delta Zw$ below the wafer. If the imaging magnification of the lens 64 shown in FIG. 9 is assumed to be $M_{64}$ and that of the reduction lens $M_4$ (either of them is less than 1), the total horizontal magnification $M = M_{64} \cdot M_{64}$, so $\Delta Zw$ is given by the following equation with regard to the vertical magnification, using $\Delta Zp$ shown in FIG. 9:

$$\Delta Zw = M^2 1/2 \Delta Zp$$

Figure 13:
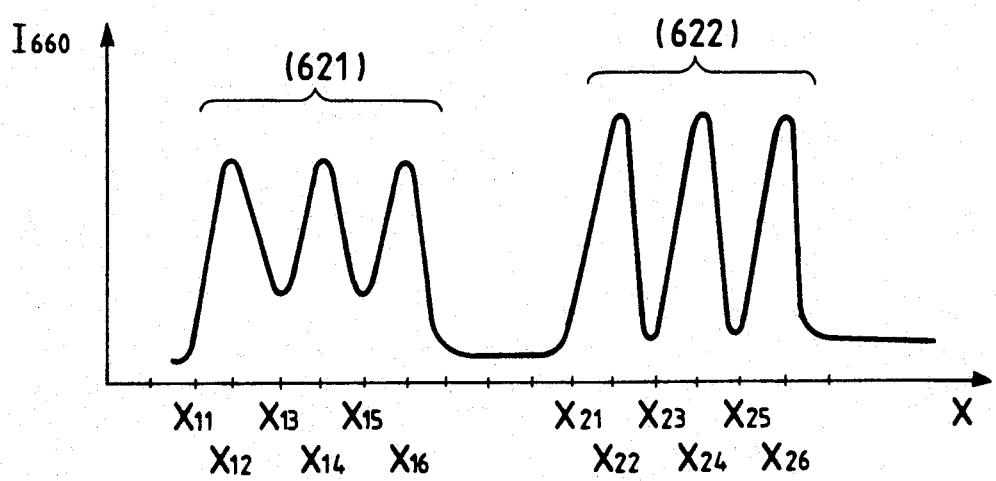
FIG. 13 is a graphical representation of the waveform of a focusing signal sent from a CCD.
Figure 14:
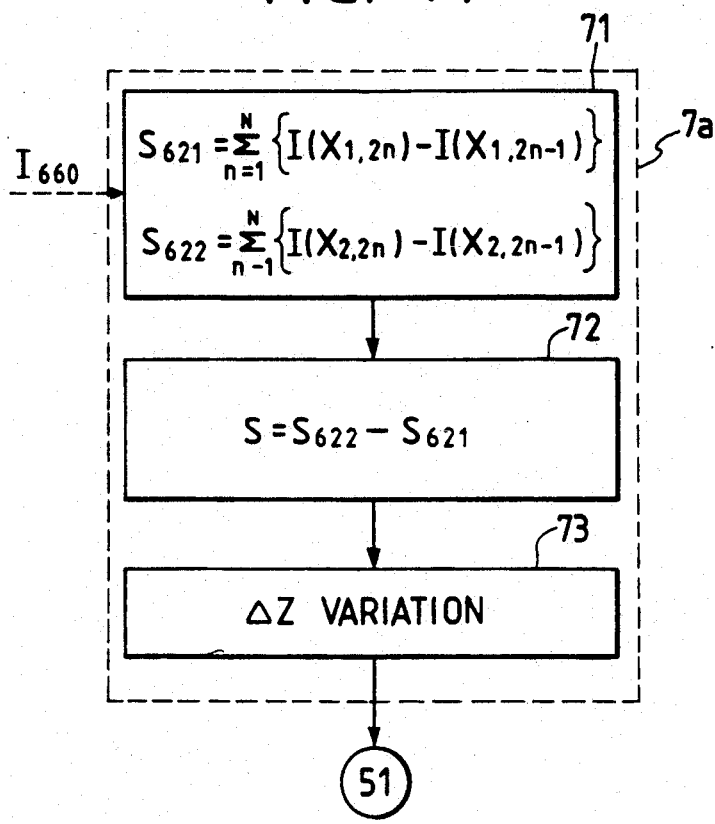
FIG. 14 is an illustration of the flow of processes in a control circuit.
Figure 15:
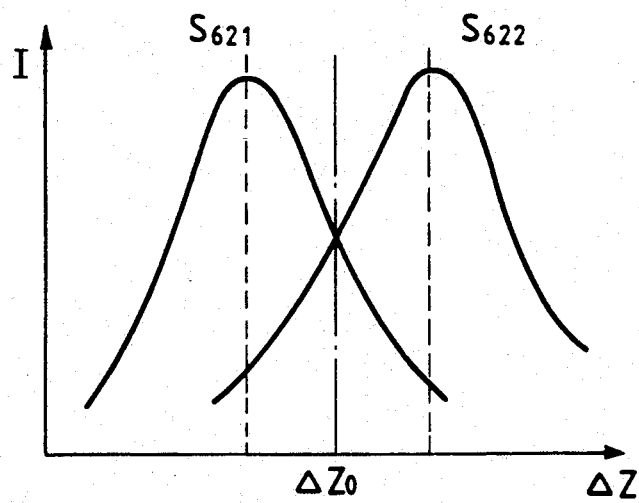
FIG. 15 is a graphical representation of the CCD detection output during defocusing.

The light projecting an image on the wafer by the $\pm \Delta Zw$ defocusing for the wafer is reflected from the wafer, goes in reverse in the same optical path, forms an image again above and below the exposure detection grating pattern 3a, becomes diffracted and forms an image once more on an CCD 660 shown in FIG. 9. Since this CCD 660 is situated so as to conjugate with the wafer, the stripe patterns 621 and 622 are imaged by defocusing in positive or negative direction. FIG. 13 illustrates the signal obtained by the CCD 660 when the wafer is conditioned by defocusing to be away from the best focusing location and a little closer to the location for imaging the stripe pattern 622. As shown in FIG. 14, the differences $S_{621}$ and $S_{622}$ between the maximal value sum and the minimal value sum for the CCD pixels for the respective 621 and 622 images are calculated by the modulation calculating circuit in a control circuit 7a, the difference S between the obtained values is calculated in 72, and the result is then used to change the wafer stage by $\Delta Z$. FIG. 15 shows the relation between the above-noted signals representing $S_{621}$ and $S_{622}$ and the $\Delta Z$ defocusing, and it is ensured that when both signals almost equals each other the best focusing is achieved.

Figure 16:
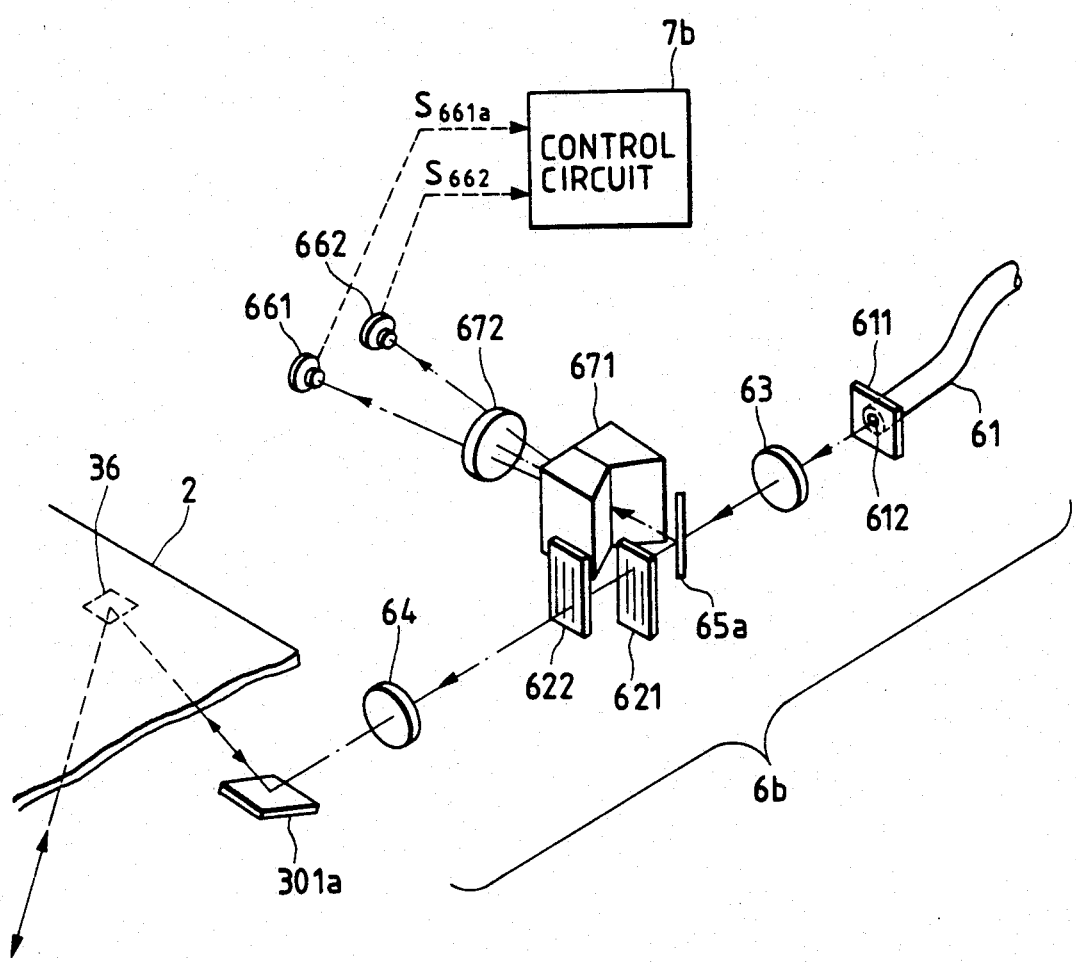
FIG. 16 is a third illustration of a focusing detector according to the present invention.

FIG. 16 illustrates an embodiment of the present invention. FIGS. 9 and 16 share common reference numerals. In this embodiment, a beam splitter 65a is situated just in front of the stripe patterns 621 and 622. The detection light coming back from the wafer passes through these stripe patterns 621 and 622 again, the light transmitted by both stripe patterns is separated from each other by a prism immediately after reflected from the beam splitter 65a, and the transmission intensity of the light carrying each of the stripe patterns 621 and 622 is detected by using a lens 672 and detectors 661 and 662. The signals $S_{661a}$ and $S_{662a}$ resulting from this detection show almost the same curves as in FIG. 15 in response to the variation from the best focusing $\Delta Z = \Delta Z_0$, thus a control circuit 7b obtaining a wafer stage control signal.

Figure 17A:
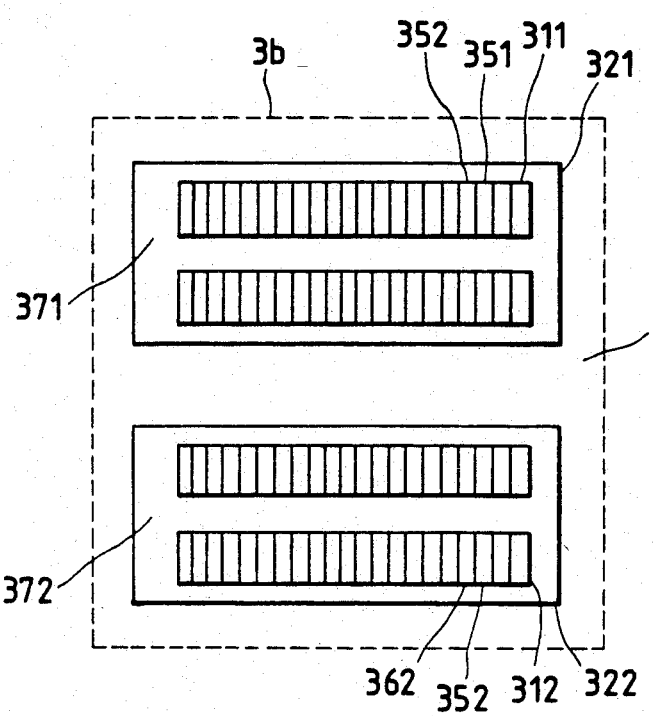
FIG. 17(a)-17(c) are a third example of the fine pattern on an original pattern.
Figure 17C:
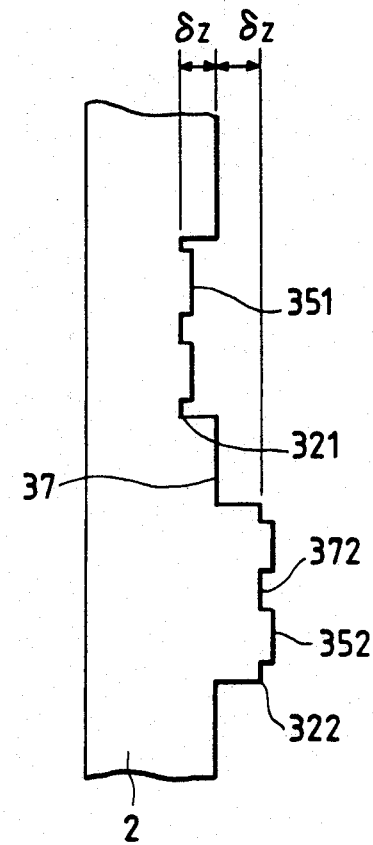
Figure 17B:
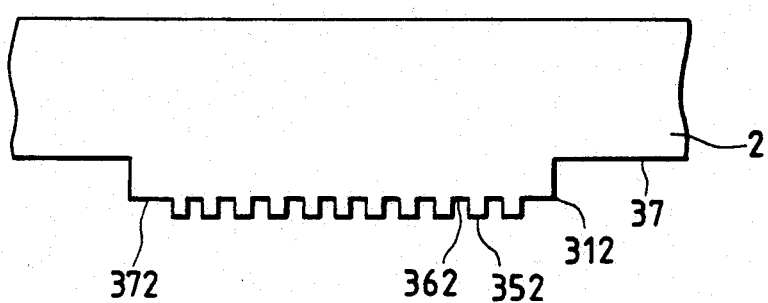
Figure 18:
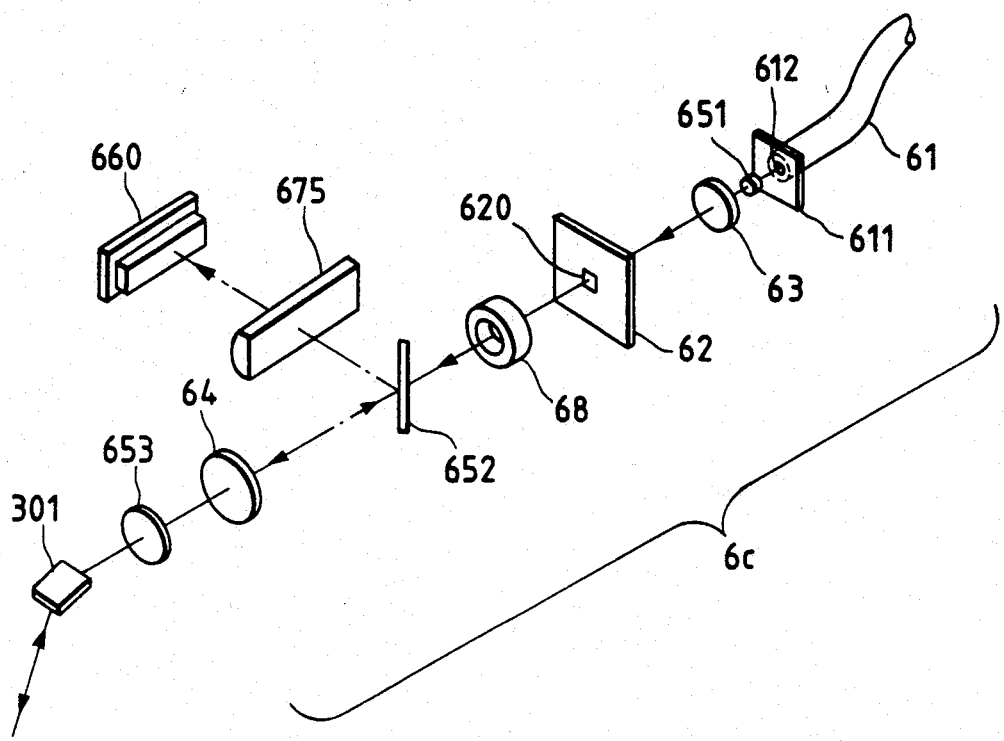
FIG. 18 is a fourth illustration of a focusing detector according to the present invention.

FIG. 17 is an embodiment of the present invention. FIG. 17 (a) is a plan view of the reticle 2, FIG. 17 (b) and FIG. 17 (c) side views of it. The exposure detection pattern area 3b has phase modulation fine pattern dispositions 311 and 312, which has been described in reference to FIG. 3, on a surface $\pm \delta z$ far from the same surface 37 as the drawn circuit pattern. The value of $\delta z$ is almost equal to the distance between the reticle surface (3a) described earlier in reference to FIG. 12 and the image surfaces 621I and 622I. The exposure detection pattern 3b except the phase modulation fine pattern dispositions shields light. FIG. 18 illustrates an exposure light projection focusing detector 6 using this reticle. FIGS. 7 and 18 share common reference numerals. In this embodiment, a shutter 68 is used for controlling the quantity of focusing detection light for exposing the wafer. The phase modulation fine pattern disposition as described above is used here to make the most of light, and a cylindrical lens 675 for longitudinally condensing this fine pattern disposition imaged in the detector 660 is also used to make further use of light. As a result, opening the shutter 68 for a very short time obtains a detection signal, thus making focus point detection possible without permitting the resist-etchant on the wafer to respond to light. The signal obtained by the CCD 660 in this embodiment shows a curve such as in FIG. 13. In FIG. 17, only two fine pattern dispositions 311 and those 312 are used. But they can be increased in number, a low pattern group 321 and a high pattern group 322 separated by such a means as shown in FIG. 16, the detection light rays from these pattern groups obtained, and each light ray handled by a highly sensitive detector (such as a photomultiplier). In this manner, it is possible to perform light detection operation regardless of the exposure of the resist-etchant and therefore to detect light in a shorter time.

Figure 20:
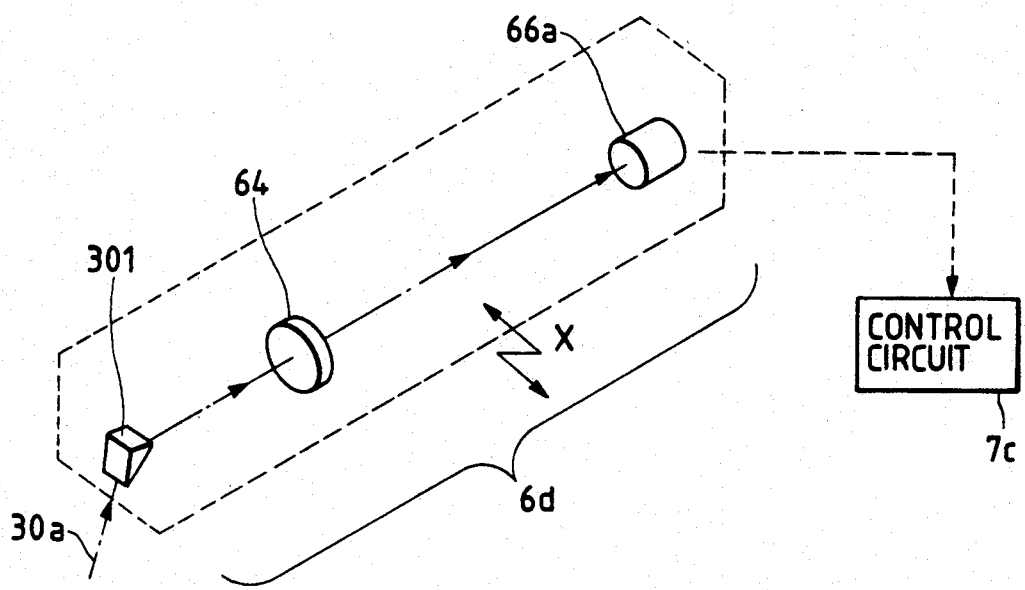
FIG. 20 is a fifth illustration of a focusing detector according to the present invention.
Figure 19:
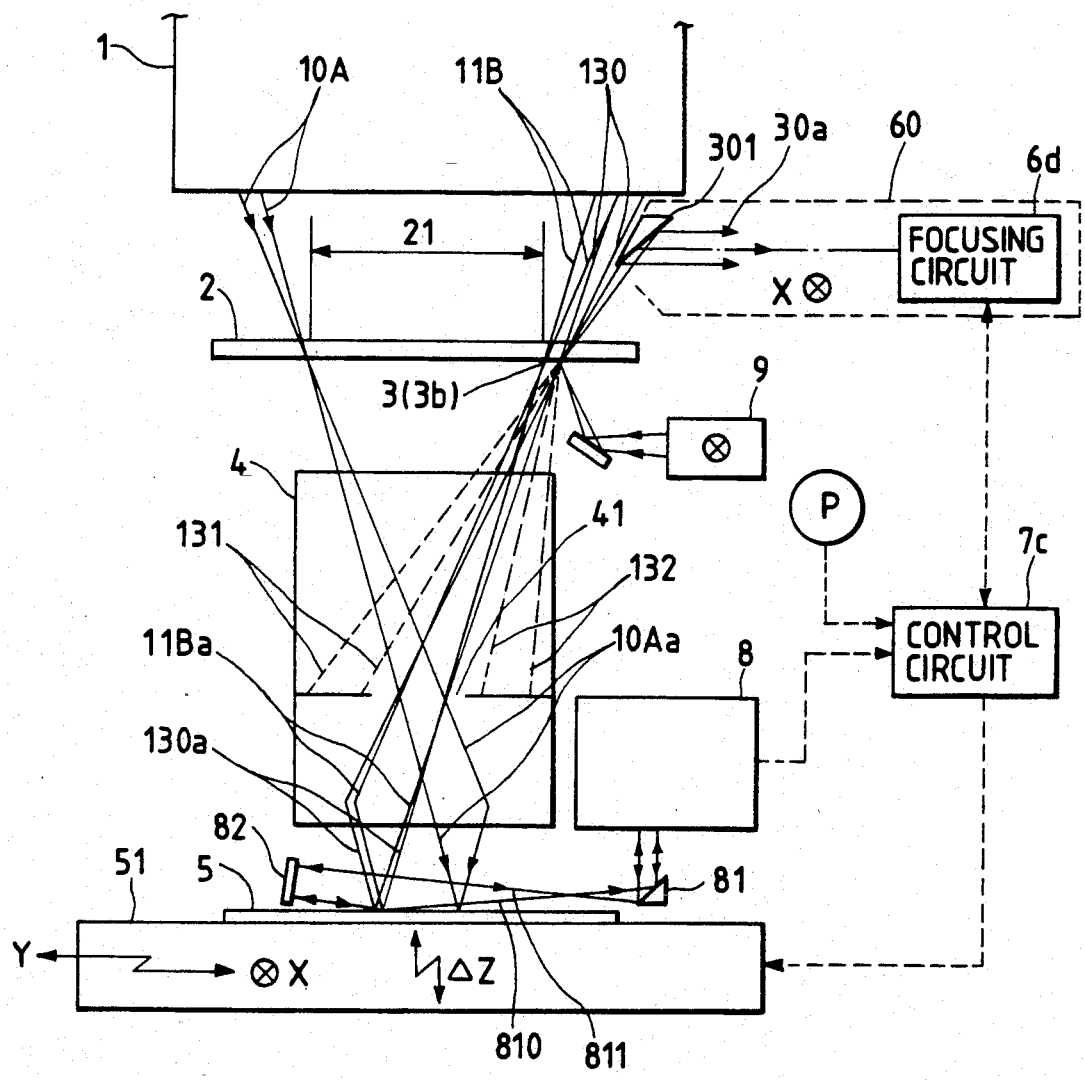
FIG. 19 is a block diagram of a projection type exposure apparatus which is a fourth embodiment of the present invention.
Figure 21A:
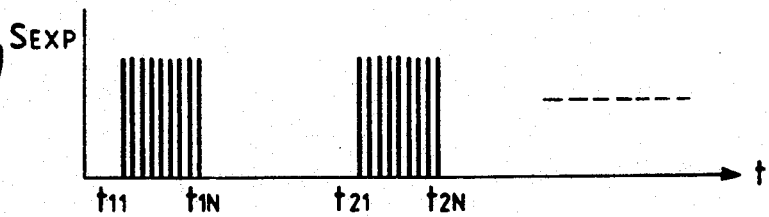
FIG. 21(a)-21(f) are a graphical representation of the timing of the driving of the embodiment of FIG. 19.
Figure 21B:
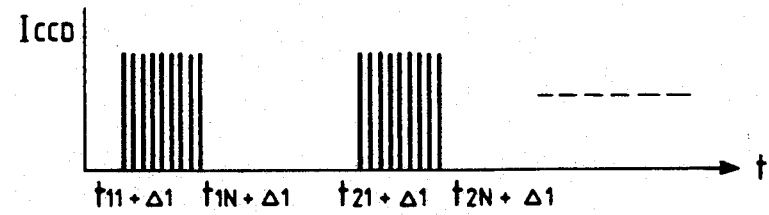
Figure 21C:
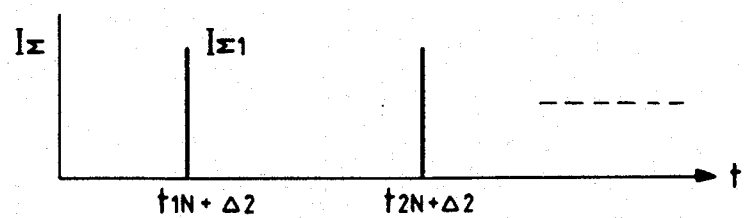
Figure 21D:
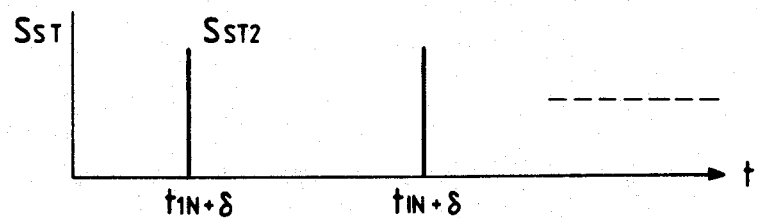
Figure 21E:
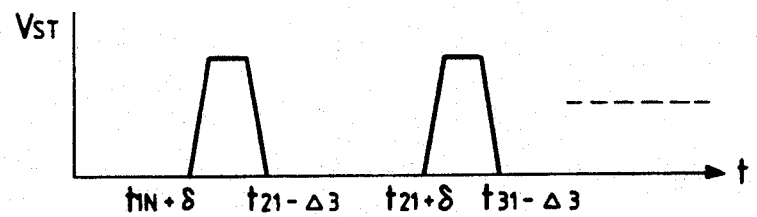
Figure 21F:
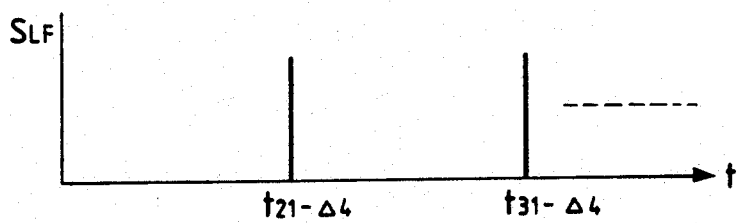

FIG. 19 is an embodiment of the present invention. The numeral 1 denotes an exima-laser exposure illumination system. Exima-laser exposure equipment is used for exposing to light large scale integrated circuits not more than 0.5 μm in size. However, the conductors are not more than ±0.3 μm wide, the focus depth is as small as ±0.5 μm and the reduction lens used for exima-laser is very dependent on temperature in terms of the refractive index. This leads to the serious problem of the variation of the focus point due to the change of the exposure energy. It will be all the more important to achieve the object of the present invention. The directivity and coherence of exima-laser used as the light source for a semiconductor exposure apparatus does not allow a simple enlarged emission of the ray to obtain good patterns. As shown in the Japanese Patent Application Laid-Open No. 62-231924 applied for by the inventor, therefore, a chip on the wafer is exposed to light by changing the directivity of the light every time pulse excited emission is given by the exima-laser and at the same time illuminating the reticle with dozens of pulses. The exposure illumination system 1 shown in FIG. 19 also uses such a plurality of pulses and changes the illumination directivity every time pulse emission is given. The light illuminates the circuit pattern 21 on the reticle and the area for scribing shown in FIG. 1. This means that the exposure detection pattern area 3 within the area for scribing 22 is illuminated along with the circuit pattern 21. Therefore, this illumination light 130, together with circuit pattern illumination light 10A and 11B, illuminates the exposure detection pattern area 3 or 3b shown in FIG. 2, 3 or 17 every time pulse excited emission is given. The 0th order light passed through the fine pattern dispositions 31, 311 and 312 on the exposure detection pattern areas 3 and 3b passes through the reduction lens pupil 41. The 1st order diffracted light does not pass through the pupil, a bar-like pattern thus being imaged on the wafer along the fine pattern disposition whose fine structure along the fine pattern disposition is distinguishable. When this imaging light is reflected from the wafer and directed upward to the fine pattern disposition on the reticle, the achievement of the focused status of the reticle and the wafer causes the intensest 1st order diffracted light 30' to go to a focusing detector 6d. In short, in this embodiment, an illumination system designed specially for focusing is not necessary, the light for the exposure illumination system being usable for this purpose. FIG. 20 sketchily illustrates a focusing detector 6d in this embodiment. Since such a special illumination system is unnecessary, the pattern along the X-axis which is carried by the detection light 30a is imaged on the CCD 660 by the lens 64. The pattern perpendicular to the X-axis is imaged on a light detector 66a by a cylindrical lens to use detection light more efficiently. A CCD may be used as the light detector 66a for the detection by imaging, or the light may be condensed for the detection by using partial or total light quantity.

Now, the operation of an exima-laser reduction exposure apparatus of FIG. 19 when it embodies the present invention will be described in reference to (A) to (F) in FIG. 21. As a result of the projection of light in accordance with the exima-laser pulse excited emission signal $S_{EXP}$ shown in (A), a signal $I_{CCD}$ shown in (B) (a timing signal for obtaining such a one-dimensional signal as shown in FIG. 13) provides a onedimensional signal representing N times of pulse excited emission. After the N times of emission, the sum $I\Sigma_1$ (onedimensional signal) of N signals for each pixel is calculated according to the timing shown in (C). In other words, $I\Sigma_1$ represents the detection light obtained from the entire exima-laser pulse light emitted while one chip is exposed, and it is used decisively for focusing. An example of its detected waveform is shown in FIG. 13. Then, this one-dimensional signal is used to perform focusing control. It is obvious that a fine pattern disposition for use can be the disposition shown in either FIG. 2, 3 or 17. Since exima-laser exposure uses the exposure light as the detection light for focusing, the result of such focusing detection is only usable for the subsequent pulse exposure operations. A method for using this result effectively may be to use, say, 100 pulses for exposing one chip, to allocate the first 10 pulses for obtaining a focusing signal and the remaining 90 pulses for the exposure at the location of the focus point controlled by using the obtained focusing signal. But in FIG. 21 the entire pulse light is used for focusing and then the result from this is used for the focusing for the next chip exposure. To achieve accurate focusing, it is necessary that, when the wafer stage is moved in stepwise and repeated manners, the surface of the resist-etchant on the wafer should be positioned in relation to the end of the reduction lens with regard to the height and gradient so as to achieve good reproducibility. For this purpose, as shown in the embodiment of FIG. 19, a gradient and height detector 8 is used which is an application of laser beam coherence (the detector is described in the Japanese Patent Application No. 02-64155). In this method, as explained in reference to FIG. 21, exposure light is used to find the focus point in the middle of exposure operation, on completion of the exposure operation ($t=t_{IN}$) the wafer stage is moved stepwise ($t=t_{IN}+\delta$), the focus point location for the next exposure being at the same time calculated ($t=t_{IN}+\Delta$), on completion of the stepwise movement ($t=t_{21}-\Delta_3$) the gradient and height is obtained ($t=t_{21}-\Delta_4$) by the gradient and height detector 8, the results are processed by the calculation by the control circuit 7c shown in FIG. 19, the wafer stage 51 is positioned by the control at a location which achieves best focusing before the start of the next exposure pulse ($t=t_{21}$). This makes accurate focusing and control possible even with exima-laser steppers which varies the directivity of the illumination every time pulse excited emission is given, uses all the plurality of pulses and thus allows one chip to be exposed with high resolution. This method is very efficient also in terms of apparatus composition since it can do without an illumination system designed specially for focusing. In the embodiment shown in FIG. 19, the fine pattern disposition 3 (3b) for focusing receives the same illumination as the exposure light for the circuit pattern, so the bar-like pattern formed by 0th order light on the wafer has a little less intensity than the circuit pattern (because ±1st order diffracted light does not enter the pupil). If a trouble arises from the incomplete exposure, a method may be employed for overexposing the area. Another method for it will be to move the focusing detector 6d in the direction shown in FIGS. 19 and 20 with the fine pattern disposition being recorded at an adjacent location corresponding to the movement. This flattens the surface of the wafer to which the pattern on the reticle is projected for focusing and therefore makes stable and accurate focusing possible.

From the above, it will be obvious that the focusing by using circuit pattern exposure light as shown in FIG. 19 should be very effective also when the light source is not exima-laser but such a source as a mercury lamp.

Figure 22:
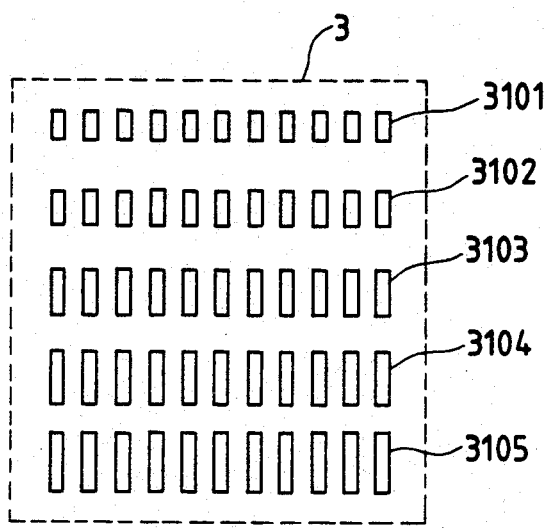
FIG. 22 is a fourth example of the fine pattern on an original pattern.
Figure 23:
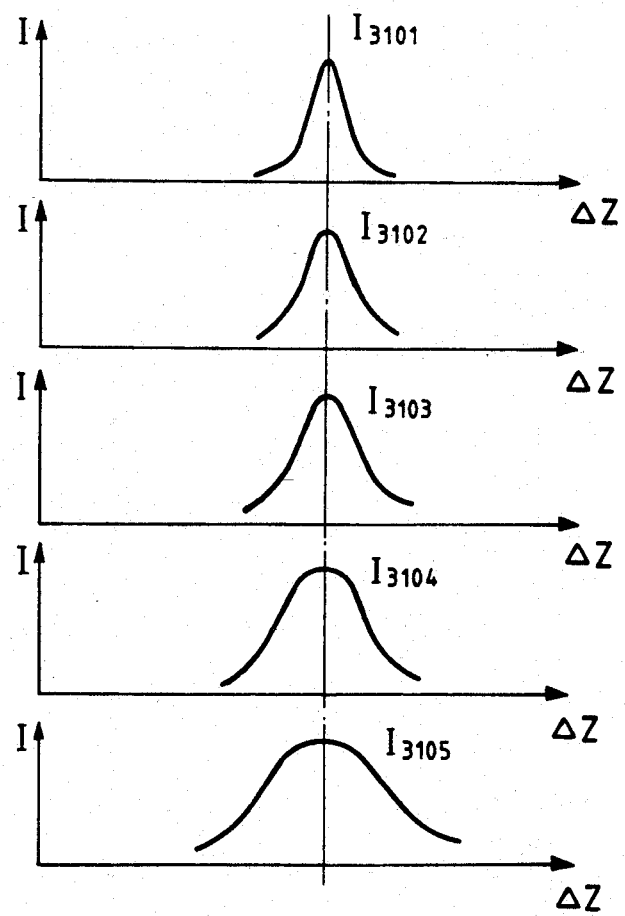
FIG. 23 is a graphical representation of the detection output from a CCD.
Figure 24:
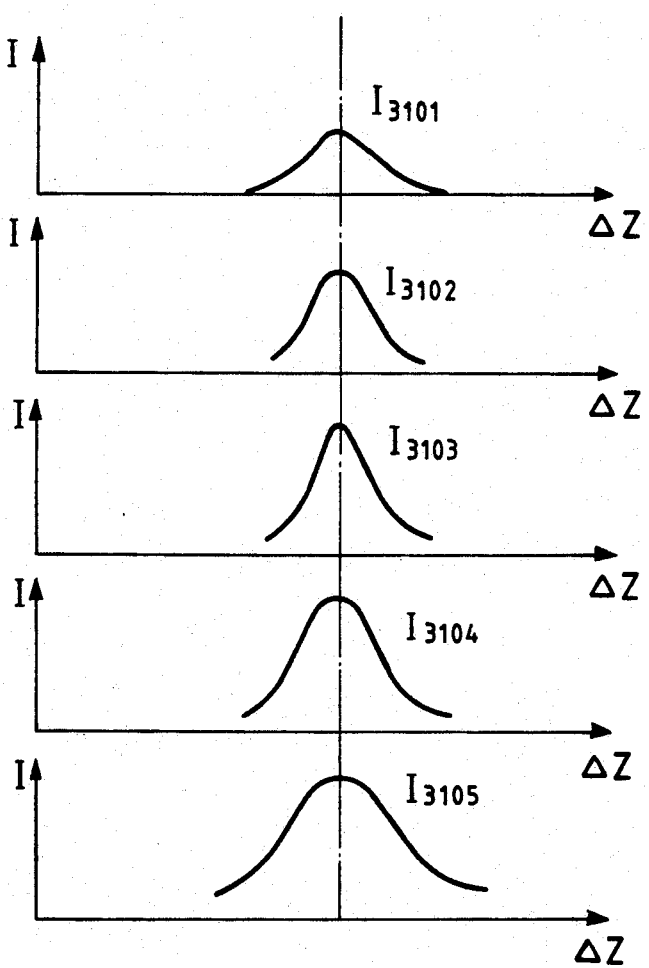
FIG. 24 is a graphical representation of the detection output from a CCD.

FIG. 22 illustrates an embodiment of the fine pattern disposition 3. These pattern dispositions of several widths are recorded as the ones drawn on the reticle so as to use the most sensitive pattern succession. To perform the selection, an image detector like a CCD may be used, or the detection light rays are added together for each pattern succession (if 2 detection light rays are used, a separation prism is used such as 671 shown in FIG. 16). These method obtains such a focusing signal as shown in FIGS. 23 and 24 as described earlier. Focusing signals $I_{3101}$ to $I_{3105}$ shown in FIGS. 23 and 24 correspond to the fine pattern successions 3101 to 3105 in FIG. 22. For the signals of FIGS. 23 and 24, $I_{3101}$ and $I_{3103}$ are good for use respectively.

Note that the above embodiment uses one focus point detection system. Detecting more than two locations around the exposure field enhances the focusing precision.

EFFECTS OF THE INVENTION

According to the present invention, the accurate focusing for exposing to projected light such fine patterns as an LSI whose conductors are not more than 0.5 μm can be performed each time the exposure operation can be performed or at short intervals, even when the focus point varies in response to exposure hysteresis or environmental change. Therefore, controlling and keeping the exposure apparatus within a desired focus depth can be achieved despite such obstacles as the irregularities on the wafer, and so it is possible to produce LSIs whose conductors are not more than 0.5 μm wide with a higher yielding rate.

What is claimed is:

1. A projection type exposure method for exposing a circuit pattern provided on a mask to a substrate to be exposed though a projection optical system by projecting exposure illumination light onto the mask utilizing a step-and-repeat projection sequence in which the substrate is horizontally moved a predetermined distance for the step-and-step repeat operation, comprising the steps of:

projecting a focus adjusting pattern through the projection optical system in a projection field of the substrate utilizing light having substantially a same wavelength as the exposure illumination light and re-imaging the projected focus adjusting pattern through the projection optical system onto at least one of the mask and a position corresponding thereto;

1st order diffracting the re-imaged focus adjusting pattern outside of a bundle of the exposure illumination light by a lattice pattern arranged as a plurality of fine patterns in a direction of at least one dimension, the lattice pattern being provided at a peripheral portion of the circuit pattern on the mask;

detecting at least one of intensity of the 1st order diffracted light and contrast of a 1st order diffracted image; and controlling an exposure surface of the substrate with respect to a focal plane of the projection optical system in the step-and-repeat projection sequence in accordance with the detection of at least one of the intensity and contrast.

2. A projection type exposure method according to claim 1, wherein the projected focus adjusting pattern is formed by the lattice pattern provided at the peripheral portion of the circuit pattern on the mask.

3. A projection type exposure method according to claim 1, wherein the projected focus adjusting pattern is projected in a projection field of the substrate as 1st order diffracted light of the lattice pattern provided at the peripheral portion of the circuit portion on the mask.

4. A projection type exposure method according to claim 2, wherein the lattice pattern is finer than a resolution limit of the projection optical system with respect to fine pattern size along a first dimension and is at least substantially equal to the resolution limit with respect to the fine pattern size in a dimension transverse to the first dimension.

5. A projection type exposure apparatus for exposing a circuit pattern provided on a mask to a substrate to be exposed through a projection optical system by projecting exposure illumination light onto the mask utilizing a step-and-repeat projection sequence in which the substrate is horizontally moved a predetermined distance for the step-and-repeat operation, comprising:

projection means for projecting a focus adjusting pattern through the projection optical system in a projection field of the substrate utilizing light having substantially a same wavelength as the exposure illumination light and for re-imaging the projected focus adjusting pattern through the projection optical system onto at least one of the mask and a position corresponding thereto;

diffraction means for 1st order diffracting the re-imaged focus adjusting pattern outside of a bundle of the exposure illumination light by a lattice pattern arranged as a plurality of fine patterns in a direction of at least one dimension, the lattice pattern being provided at a peripheral portion of the circuit pattern on the mask;

detection means for detecting at least one of intensity of the 1st order diffracted light and contrast of a 1st order diffracted image diffracted by the diffraction means; and control means for controlling an exposure surface of the substrate with respect to a focal plane of the projection optical system in the step-and-repeat projection sequence in response to the detection means.

6. A projection type exposure method for exposing a circuit pattern provided on a mask to a substrate to be exposed through a projection optical system by projecting exposure illumination light of an exima-pulse laser a plurality of times onto the mask utilizing a step-and-repeat projection sequence in which the substrate is horizontally moved a predetermined distance in the step-and-repeat operation, comprising the steps of:

projecting a focus adjusting pattern through the projection optical system in a projection field of the substrate by illuminating the exima-pulse laser and re-imaging the projected focus adjusting pattern through the projection optical system onto at least one of the mask and a position corresponding thereto;

1st order diffracting the re-imaged focus adjusting pattern outside of a bundle of the exposure illumination light by a lattice pattern arranged as a plurality of fine patterns in a direction of at least one dimension, the lattice pattern being provided at a peripheral portion of the circuit pattern on the mask;

detecting by summing at least one of an amount of the 1st order diffracted light and contrast of a 1st order diffracted image while the exima-pulse laser is illuminated; and controlling an exposure surface of the substrate with respect to a focal plane of the projection optical system in the step-and-repeat sequence in accordance with at least one of the amount of the 1st order diffracted light and contrast of the 1st order diffracted image.

7. A projection type exposure method according to claim 6, wherein the step of controlling includes compensating for a detected height and inclination of the exposure surface of the substrate in accordance with at least one of the detected 1st order diffracted amount and contrast so as to control the exposure surface of the substrate to the best focal plane of the projection optical system.

8. A projection type exposure apparatus for exposing a circuit pattern provided on a mask to a substrate to be exposed through a projection optical system by projecting an exposure illumination light of an exima-pulse laser a plurality of times onto the mask utilizing a step-and-repeat projection sequence in which the substrate is horizontally moved a predetermined distance in the step-and-repeat operation, comprising:

projecting means for projecting a focus adjusting pattern through the projection optical system in a projection field of the substrate by illuminating the exima-pulse laser and re-imaging the projected focus adjusting pattern through the projection optical system onto at least one of the mask and a position corresponding thereto;

diffraction means for 1st order diffracting the re-imaged focus adjusting pattern outside of a bundle of the exposure illumination light by a lattice pattern arranged as a plurality of fine patterns in a direction of at least one dimension, a lattice pattern being provided at a peripheral portion of the circuit pattern on the mask;

detection means for summing at least one of an amount of the 1st order diffracted light and contrast of a 1st order diffracted image while the exima-pulse laser is illuminated; and controlling means for controlling an exposure surface of the substrate with respect to a focal plane of the projection optical system in the step-and-repeat projection sequence in response to the detection means.

9. A projection type exposure apparatus according to claim 8, wherein the controlling means includes means for compensating for a detected height and inclination of the exposure surface of the substrate in response to the detection means so as to control the exposure surface of the substrate to a best focal plane of the projection optical system.

* * * * *